(12) United States Patent
Guenter et al.

(10) Patent No.: US 9,184,855 B2
(45) Date of Patent: Nov. 10, 2015

(54) OPTO-ISOLATOR INCLUDING A VERTICAL CAVITY SURFACE EMITTING LASER

(71) Applicant: FINISAR CORPORATION, Sunnyvale, CA (US)

(72) Inventors: James K. Guenter, Garland, TX (US); Jimmy A. Tatum, Plano, TX (US); Norman Brent Stapleton, Princeton, TX (US); Richard L. Bell, Richardson, TX (US); Harold Young Walker, Plano, TX (US); Jose Joaquin Aizpuru, Murphy, TX (US)

(73) Assignee: FINISAR CORPORATION, Sunnyvale, CA (US)

( * ) Notice: Subject to any disclaimer, the term of this patent is extended or adjusted under 35 U.S.C. 154(b) by 0 days.

(21) Appl. No.: 14/216,700

(22) Filed: Mar. 17, 2014

(65) Prior Publication Data

US 2014/0197338 A1    Jul. 17, 2014

Related U.S. Application Data

(62) Division of application No. 12/946,795, filed on Nov. 15, 2010, now Pat. No. 8,675,701, which is a division of application No. 12/027,391, filed on Feb. 7, 2008, now Pat. No. 7,835,410.

(60) Provisional application No. 60/888,790, filed on Feb. 8, 2007, provisional application No. 60/888,719, filed on Feb. 7, 2007.

(51) Int. Cl.
| | | |
|---|---|---|
| *H01S 5/00* | (2006.01) |
| *H04B 10/80* | (2013.01) |
| *H01S 5/183* | (2006.01) |
| *H01S 5/022* | (2006.01) |

(52) U.S. Cl.
CPC .............. *H04B 10/802* (2013.01); *H01S 5/183* (2013.01); *H01S 5/02288* (2013.01); *H01S 5/02292* (2013.01)

(58) Field of Classification Search
CPC ..... H01S 3/0014; H01S 3/02; H01S 3/08059; H01S 3/0933; H01S 3/10015; H01S 3/1305; H01S 3/23; H01S 5/00; H01S 5/022; H01S 5/0262; H01S 5/183
USPC ...................... 372/50.1, 50.124, 50.23, 50.21
See application file for complete search history.

(56) References Cited

U.S. PATENT DOCUMENTS 6,567,435 B1 *   5/2003   Scott et al. ................ 372/29.021
2006/0162104 A1 *   7/2006   Malone et al. ................ 15/97.1

* cited by examiner

*Primary Examiner* — Dung Nguyen
(74) *Attorney, Agent, or Firm* — Maschoff Brennan (57) ABSTRACT

An opto-isolator is disclosed that include a vertical cavity surface emitting laser (VCSEL), a photodetector and a package enclosing the VCSEL and the photodetector. The photodetector is optically coupled to the VCSEL and configured to receive an output optical signal generated by the VCSEL.

20 Claims, 9 Drawing Sheets

OPTO-ISOLATOR INCLUDING A VERTICAL CAVITY SURFACE EMITTING LASER

CROSS-REFERENCE TO RELATED APPLICATIONS

This application is a divisional of U.S. Utility application Ser. No. 12/946,795, entitled OPTO-ISOLATOR INCLUDING A VERTICAL CAVITY SURFACE EMITTING LASER, filed Nov. 15, 2010 which is a divisional of U.S. Utility application Ser. No. 12/027,391 entitled OPTO-ISOLATOR INCLUDING A VERTICAL CAVITY SURFACE EMITTING LASER filed Feb. 7, 2008, which claims the benefit of U.S. Provisional Patent Application No. 60/888,719, filed Feb. 7, 2007, and U.S. Provisional Patent Application No. 60/888,790, filed Feb. 8, 2007, each of which are incorporated herein by reference in their entireties and for all purposes.

BACKGROUND

Electronic noise is one of the limiting factors in today's circuits. At least some of the electronic noise typically derives from back end digital signal processing, typically from the power supply and switching transistors. This electronic noise is deleterious to the performance of analog integrated circuits.

A device referred to as an opto-isolator (also referred to as an optical isolator, optocoupler and photocoupler) is often used to reduce noise in electrical circuits. Opto-isolators electrically isolate portions of a circuit thereby reducing noise. An opto-isolator uses a short optical transmission path to transfer a signal between elements of a circuit, typically a LED and a receiver, while keeping them electrically isolated. The LED and light sensor are separated so that light may travel across a barrier but electrical current may not. When an electrical signal is applied to the input of the opto-isolator, the LED generates a light signal, and a light detector generates a corresponding electrical signal as the output when the LED receives the light signal. When a photodiode is used as the light detector, the output current is proportional to the amount of incident light supplied by the LED. The ratio of the amount of current output by the photodiode to the amount of current input to the LED is referred to as the current transfer ratio.

Conventional embodiments utilizing LEDs have been limited, however, to low speed opto-isolation applications because they are limited by the response time of the LED. These conventional embodiments have also been limited in their current transfer ratio due to high power dissipation of LED emitters. The subject matter claimed herein is not limited to embodiments that solve any disadvantages or that operate only in environments such as those described above. Rather, this background is only provided to illustrate an example of technology areas where some embodiments may be practiced.

SUMMARY

An opto-isolator is disclosed that includes a vertical cavity surface emitting laser (VCSEL) and a photodetector that is optically coupled to the VCSEL. The photodetector is configured to receive an output optical signal generated by the VCSEL. The opto-isolator further includes a package that encloses the VCSEL and the photodetector.

In certain embodiments, the VCSEL may be disposed adjacent to the photodetector and optically coupled to it by way of a redirection of the output optical signal. The redirection of the output optical signal might be achieved by way of one or more reflective surfaces. The one or more reflective surfaces might receive and redirect the output optical signal through air, or through a material. In one optional implementation, a reflective surface is unitarily formed with an encapsulant.

These and other features will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SEVERAL EMBODIMENTS

Several of the embodiments disclosed herein relate to opto-isolators having increased speed capabilities, lower power dissipation, simplified design, improved manufacturability, smaller footprint, lower cost, and/or better current transfer ratio as compared to conventional opto-isolators. In particular, several opto-isolators disclosed herein may be particularly advantageous in certain applications, such as high-speed optical communications, testing equipment (such as high speed oscilloscopes), computing, radio, wireless connections, as well as many other applications and circuits. Some embodiments disclosed herein may have improved performance characteristics, such as improved response time enabling high-speed applications and/or improved current transfer ratio, as well as other improvements.

Several opto-isolators described herein include vertical cavity surface emitting lasers (VCSELs) as the opto-isolator transmitter in various integrated configurations and package designs. The opto-isolator packages disclosed herein can include a laser, a photodetector, and a laser driver contained inside a common housing. For example, various such examples and embodiments are disclosed in U.S. patent application Ser. No. 11/082,521 filed Mar. 17, 2005, the contents of which are hereby incorporated by reference herein. Similar to those embodiments disclosed in U.S. patent application Ser. No. 11/082,521, any of the packages disclosed herein can include a laser, photodetector and a laser driver within a common housing.

According to several embodiments, a reflective surface can be used to redirect optical signals emitted from a VCSEL such that they are received by a photodetector. Embodiments may also include a housing within which both the transmitter and receiver are contained. For example, the housing can include a package, such as a TO package including a can within which a VCSEL and photodiode are both contained. According to several embodiments, the VCSEL and the photodiode can be arranged in a side-by-side configuration within a can and supported by a header. Advantages of such embodiments can include simplicity of the opto-isolator design both in use and manufacturing, small size, and reduced cost.

Figure 1:
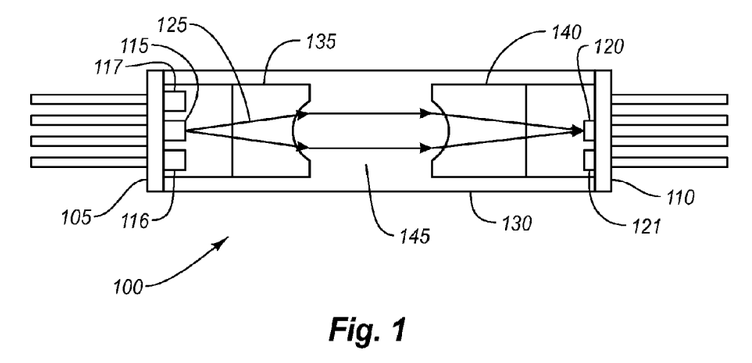
FIGS. 1-13 disclose example embodiments of opto-isolators.

Referring to FIG. 1 an opto-isolator 100 is illustrated according to an example embodiment. The opto-isolator 100 includes a transmitter optical subassembly (TOSA) 105 and an opposing receiver optical subassembly (ROSA) 110. The TOSA 105 includes a VCSEL 115 for generating optical signals 125 and the ROSA 110 includes a photodetector 120 for receiving the optical signals 125 generated by the TOSA 105. The TOSA 105 can further include a laser driver 116 for providing a drive current to the VCSEL 115. The laser driver can be located within the TOSA 105. For example, the TOSA can include the laser 115, a photodetector 117, and the laser driver 116 contained inside a common housing, such as the embodiments disclosed in U.S. patent application Ser. No. 11/082,521 filed Mar. 17, 2005. The ROSA 110 can also include a transimpedance amplifier (TIA) 121 packaged in a common housing with the photodetector. According to an example, the TOSA 105 and ROSA 110 can include a TO46 type header and can, or other type of package. The packages discussed herein are not limited to TO Can packages but can further include any other type of package. For example, a T1 type of package can be used. The packages can include plastic encapsulated packages and other configurations of TOSA and ROSA packages with, or without, lenses.

The opto-isolator 100 further includes an alignment package 130. The alignment package 130 includes a first opening 135 at a first end of the alignment package 130 configured to receive the TOSA 105. The alignment package 130 further includes a second opening 140 opposite to the first opening 135 at a second end of the alignment package 130 for receiving the ROSA 110. Thus, the first and second openings 135 and 140 are shaped and configured to receive at least a top portion, such as a can, of the type of package of the TOSA 105 and ROSA 110.

The alignment package 130 can further include a lens 145 disposed between, and separating, the first cavity 135 and the second cavity 140. The lens 145 is configured to collimate, focus, and/or refract the optical signal output 125 from the TOSA 105 such that the optical signal 125 is received by the photodetector 120. The alignment package 130 can include, or consist of, any material, such as plastic, and can be unitarily formed as illustrated by FIG. 1. According to an embodiment, the alignment package 130 can include, or consist of, Ultem or a polycarbonate material. In such embodiments, the sidewalls of the first opening 135 and second opening 140 are formed integral with the lens 145.

The alignment package 130 can also include multiple portions assembled together. For example, the alignment package 130 can include a hollow portion, which can have a general shape of a tube according to some embodiments, into which a lens is inserted and affixed, thus separating the first and second openings 135 and 140. According to an embodiment, at least a portion of the alignment package can be at least partially opaque to optical energy. Thus, the opto-isolator may more easily conform to safety regulations, such as eye safety standards, and other regulations.

Figure 2:
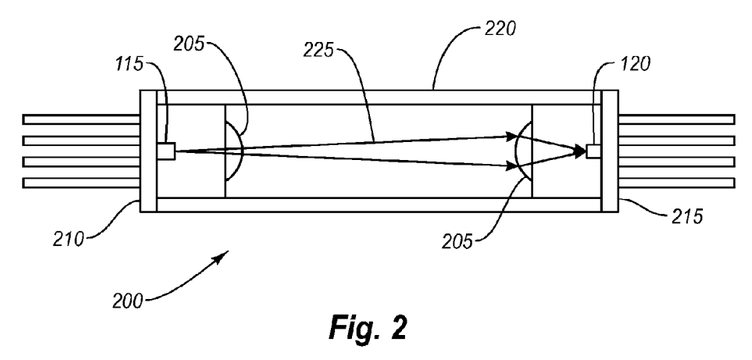

Referring to FIG. 2, another embodiment of an opto-isolator 200 is disclosed. The embodiment illustrated in FIG. 2 is similar to the embodiment illustrated in FIG. 1 except that the lens 145 (see FIG. 1) has been removed and lenses 205 are coupled with one, both, or neither of a TOSA 210 and a ROSA 215. According to an embodiment, an alignment package 220 is in the shape of a tube or other cross-sectional shape configured for receiving the TOSA 210 and ROSA 215 packages. The alignment package 220 can be at least partially opaque to optical energy. According to such embodiments, the opto-isolator 200 may more easily conform to safety regulations, such as eye safety standards, and other regulations because optical energy can be substantially prevented from leaving the interior of the alignment package 220. Additionally, an opaque alignment package 200 also prevents optical energy from being transmitted to (and from) other optical circuits causing noise in those circuits.

Figure 3:
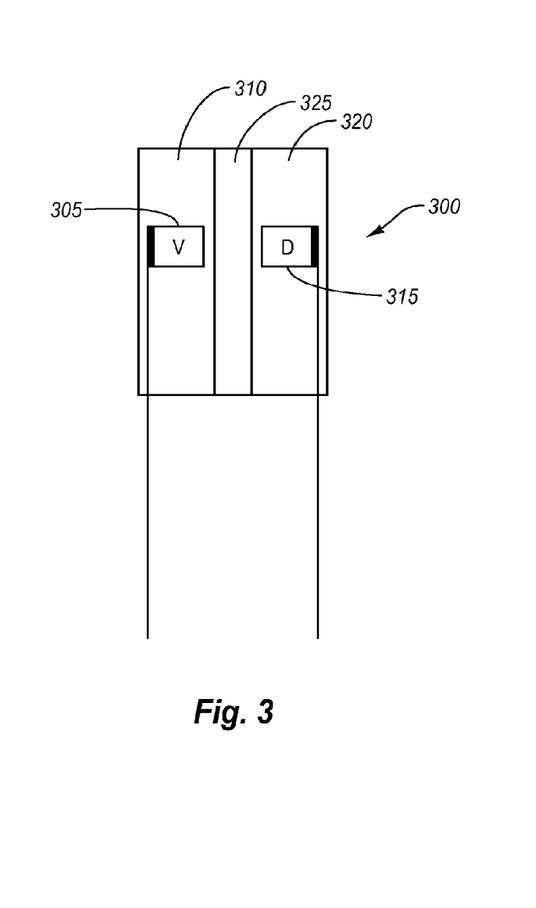

According to additional embodiments, a "sidelooker" package can be implemented such that the VCSEL and detector are directly opposed. Referring to FIG. 3, a sidelooker package 300 is illustrated where a VCSEL 305 is encased in a first package 310 and a detector 315 is encased in a second package 320. Subsequently, the encased VCSEL 305 and the encased detector 315 can be aligned, optically coupled, and secured using a securing agent, such as an optically transmissive UV curable epoxy 325 or other means for retaining alignment and coupling of the encased VCSEL 305 to the encased detector 315. As discussed above, the VCSEL 305, or other portion of the sidelooker package 300, can include lenses, such as wafer level micro-lenses. The sidelooker package 300 can further include lenses in one or more of the packages 310 and/or 320 or in the securing agent 325. Circuits including laser drivers, post amplifiers, controllers, and other circuitry can also be included in the packages 310 and 320 for controlling, or otherwise supporting, the VCSEL 305 or the detector 315. The packages 310 and 320 can include an encapsulant or other type of optical package.

Figure 4:
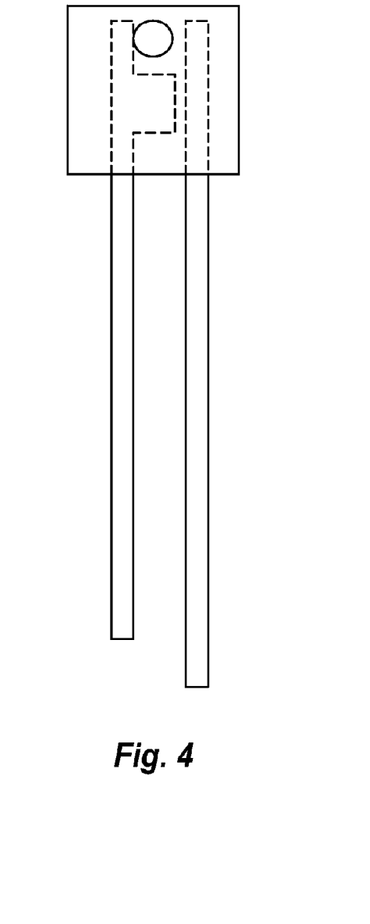
Figure 5:
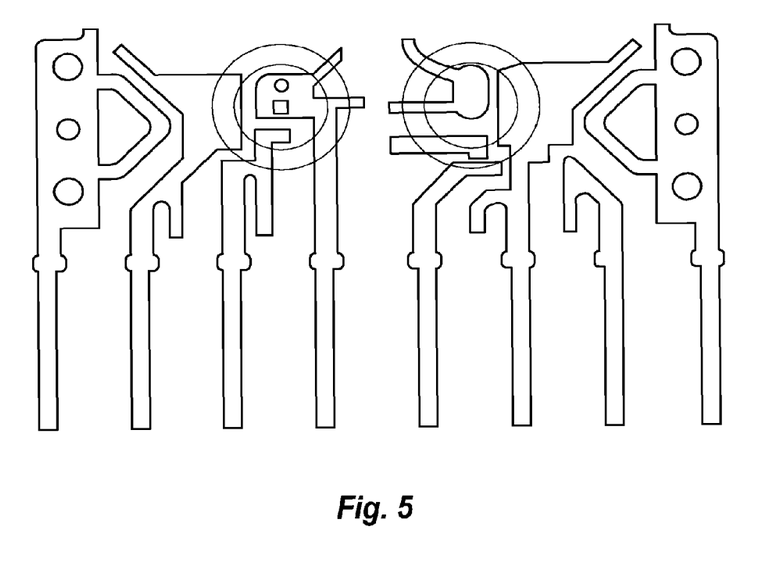

FIGS. 4 and 5 are illustrate various embodiments of the opto-isolators disclosed herein. FIG. 4 illustrates an embodiment of a sidelooker package. FIG. 5 illustrates an example of a sidelooker package that includes a laser driver and TIA circuitry.

Figure 6:
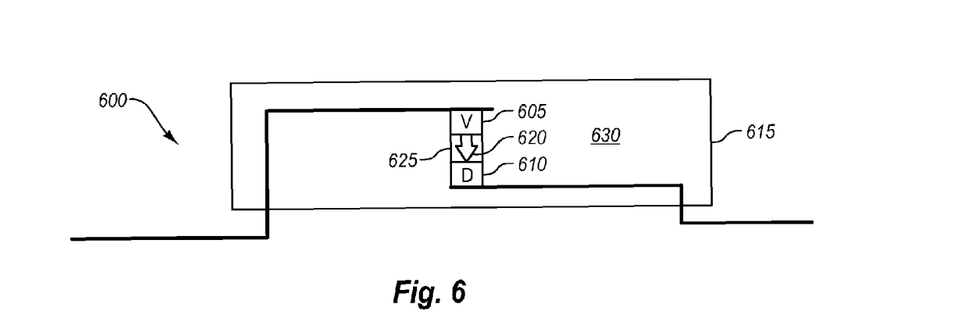

Referring to FIG. 6, an opto-isolator 600 is illustrated according to an example embodiment. As illustrated, the opto-isolator 600 can include a VCSEL 605 optically opposed to a detector 610, such as a PIN photodiode or other detector. The combination of the VCSEL 605 and detector 610 has been discovered to provide a particularly high speed response time and suitability for high-speed applications. It has also been discovered that in addition to higher response rate for high speed applications, use of the VCSEL 605 in the opto-isolator 600 also can exhibit a higher transfer ratio.

The VCSEL 605 and detector 610 are encased in a single package that includes an at least partially optically translucent encapsulant 615. The encapsulant 615 can be at least partially opaque to a particular spectrum of light. For example, the encapsulant 615 can be opaque to a frequency of light commonly found in ambient light that may cause interference with the transfer of signals 620 from the VCSEL 605 to the detector 610. The encapsulant 615 may also include multiple portions at least one portion being opaque to different wavelengths of light than another portion of the encapsulant. For example, a first portion 625 of encapsulant 615 directly between the VCSEL 605 and the detector 610 may by opaque to a first wavelength(s) of light and a second portion 630 of encapsulant 615 surrounding the VCSEL 605 and the detector 610 and surrounding the portion 625 of the encapsulant directly between the VCSEL 605 and the detector 610 may be opaque to a second wavelength(s) of light. For example, the portion 625 of the encapsulant 615 between the VCSEL 605 and the detector 610 can be transmissive to the wavelength of light transmitted by the VCSEL 605. Whereas, the portion 630 of the encapsulant 615 surrounding the VCSEL 605, detector 610, and the portion 625 may be non-transmissive to the wavelength of light transmitted by the VCSEL 605. The portion 630 of the encapsulant 615 surrounding the VCSEL 605 and the detector 610 may also be non-transmissive of wavelengths of ambient light that may cause interference in the reception of optical signals by the detector 610. By selecting the portion 630 to be non-transmissive of both ambient light and light at the wavelength transmitted by the VCSEL 605, optical noise is prevented from entering the opto-isolator 600 while optical signals generated by the opto-isolator 600 are prevented from introducing noise into other optical circuits.

A portion of the opto-isolator 600 may also include a cavity of air. For example, the opto-isolator may be at least partially hollow. The cavity of air may be located so as to allow for transmission of optical signals through air. For example, the portion 625 of the encapsulate 615 may be a void allowing for transmission of optical signals between the VCSEL and the detector through the void. The void may be filled with air, another gas, or a vacuum, for example.

Figure 7:
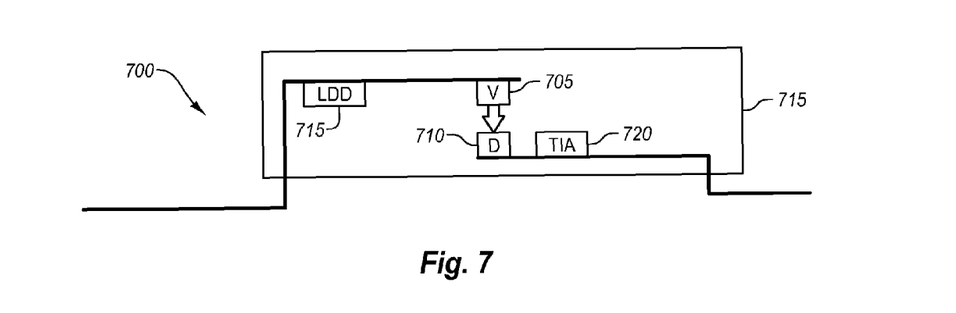

Referring to FIG. 7, an opto-isolator 700 is illustrated according to another example embodiment. The opto-isolator 700 illustrated in FIG. 7 includes a VCSEL 705 and a detector 710, such as a PIN photodiode or other detector, encased within a single package that includes an encapsulant 725. The opto-isolator 700 further includes a laser driver 715 for providing a drive current to the VCSEL 705. The opto-isolator 700 further includes a transimpedance amplifier (TIA) 720 for amplifying a signal received from the detector 710. Both the laser driver 715 and the TIA 720 are also encased within the encapsulant 725. Similar to the embodiment discussed above, with reference to FIG. 1, the encapsulant 725 can include an at least partially translucent plastic. At least a portion of the encapsulant 725 can also be transmissive to the wavelength of light transmitted by the VCSEL 705 and non-transmissive to wavelengths of light other than that transmitted by the VCSEL 705. The encapsulant 725 can also include a portion between the VCSEL 705 and the detector 710 which is transmissive to light of the wavelength transmitted by the VCSEL 705, and a portion of the encapsulant 725 surrounding the VCSEL 705 and the detector 710 can be opaque to various wavelengths including the wavelength of light transmitted by the VCSEL 705 and/or wavelengths of ambient light that may cause interference (e.g. see FIG. 6). By using the laser driver 715 and the TIA 720, a user can input, for example, logic signal levels (e.g. PECL, TTL) to the opto-isolator 700 and have logic signal levels output by the opto-isolator 700. The ratio of the level of the electrical signal output by the opto-isolator 700 to the electrical signals input to the opto-isolator 700 can also be varied by controlling the laser driver 715 and/or the TIA 700. For example, in one embodiment, a circuit electrically connected to the VCSEL 705 may input logic signals of one logic level in a particular voltage range, while a circuit electrically connected to the detector 710 may receive a signal of the same logical level, but at a different voltage level. The electronics can incorporate other functions such as logic inversion, and logic adjustment (e.g. TTL to PECL, PECL to LVDS, etc.) which may eliminate the need for other integrated circuits.

As discussed above, a portion of the opto-isolator 700 may include a void for transmission of optical signals. For example, a portion of the encapsulate 725 located between the VCSEL 705 and the detector 710 may be filled with air such that the optical signal transmitted by the VCSEL 705 is transmitted at least partially through air. Lenses, reflectors, refractors, and other optical devices may also be included between the VCSEL 705 and the detector 710 for controlling and directing optical signals.

Figure 8:
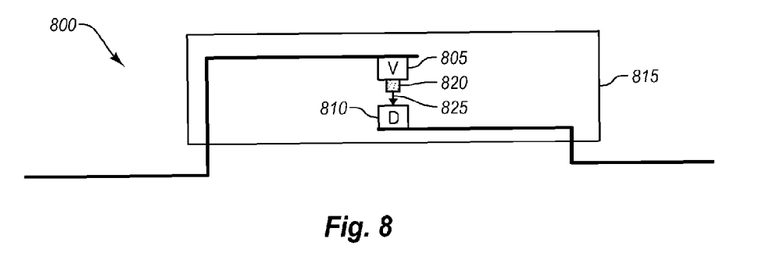

Referring to FIG. 8, an opto-isolator 800 is illustrated according to an example embodiment. The opto-isolator 800 includes a VCSEL 805 and a detector 810 encased within a package that includes an encapsulant 815. As illustrated in FIG. 8, a lens 820 or other optical collimating, focusing, or refracting device can be coupled to the VCSEL 805. The lens 820 can be implemented to improve optical coupling between the VCSEL 805 and the optical detector 810. The lens 820 can be integrated with the VCSEL 805 or otherwise optically coupled to the VCSEL 805. For example, the lens 820 can be a wafer integrated micro-optic. Examples of wafer integrated micro-optics are illustrated in U.S. Pat. Nos. 6,909,554 and 6,984,076, the contents of both patents are hereby incorporated by reference herein. The lens 820 can be coupled to the surface of the VCSEL 805 from which an optical signal 825 is produced. The optical lens 820 can improve the optical coupling of the optical signal 825 transmitted from the VCSEL 805 to the detector 810. The encapsulate 815 may further include a void as discussed above. For example, a void may be located at least partially between the VCSEL 805 and the detector 810. The lens 820 may or may not be located within the void according to such embodiments.

Opto-isolators disclosed herein can include a reflective surface. The reflective surface may be integrated with the opto-isolator or the reflective surface may be attached to the opto-isolator. For example, referring to FIG. 9 an opto-isolator 900 is illustrated. The opto-isolator 900 can include a VCSEL 905, detector 910, such as a PIN photodiode or other detector, an optional laser driver 915, and an optional TIA 920 encased within a package that includes an encapsulant 925. The encapsulant 925 can further include, or be coupled to, a reflective surface 930. The reflective surface 930 can be, for example, at least partially in the shape of an ellipse, curved, or an at least partially spherical structure. The reflective surface 930 can be other geometrical reflective surfaces including spherical, aspherical, elliptical, and pyramidal reflective surfaces, for example. The VCSEL 905 and detector 910 can be positioned relative to the reflective surface 930 such that an optical signal 935 transmitted by the VCSEL 905 is reflected by the reflective surface 930 and subsequently received by the detector 910.

Figure 9:
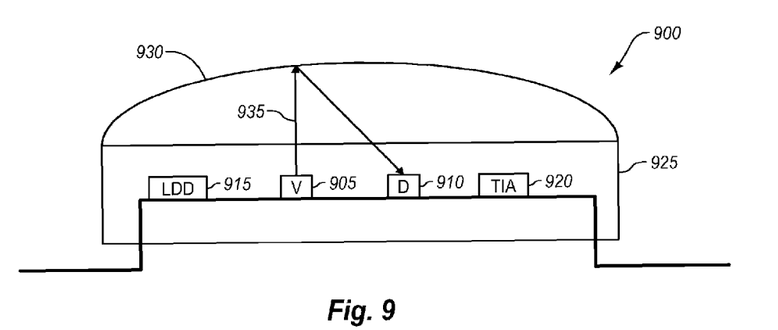

The opto-isolator 900 may include a void. For example, the opto-isolator 900 may be at least partially hollow such that the optical signal 935 is at least partially transmitted through air. Thus, the reflective surface 930 may receive and reflect the optical signal 935 through air, or the reflective surface 930 may receive and reflect the optical signal 935 through a material of the encapsulant 925. Additional optical devices may be included to control, condition and/or direct the optical signal 935.

An opto-isolator can further include multiple reflective surfaces. For example, referring to FIG. 10, an opto-isolator 1000 is illustrated according to an example embodiment. The opto-isolator 1000 includes a VCSEL 1005, a detector 1010, such as a PIN photodiode or other detector, an optional laser driver 1015, and an optional TIA 1020 incorporated within a single package that includes an encapsulant 1025. According to this embodiment, multiple surfaces 1030 are implemented with the encapsulant 1025. For example, at least one reflective surface 1030 may be included in a reflective structure 1035 incorporated with, or attached to, the encapsulant 1025, so as to redirect an optical signal 1040 generated by the VCSEL 1005 such that the optical signal 1040 is received by the detector 1010. According to the embodiment illustrated in FIG. 10, the reflective structure 1035 can include two reflective surfaces 1030 in the form of a semi-pyramidal structure. The optical signal 1040 generated by the VCSEL 1005 is twice redirected such that the optical signal 1040 is coupled to the detector 1010. Such an opto-isolator 1000 can be implemented in the form of a leadframe optical component having leads and other electrical connections to the VCSEL 1005 and the detector 1010.

Figure 10:
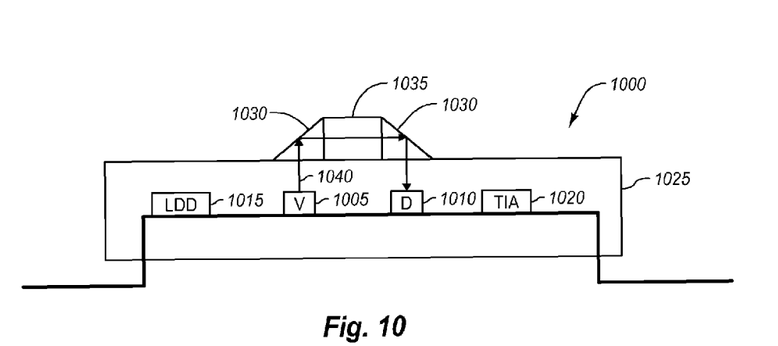

The opto-isolator 1000 may include a void. For example, the opto-isolator 1000 may be at least partially hollow such that the optical signal 1040 is at least partially transmitted through air. Thus, the reflective surfaces 1030 may receive and reflect the optical signal 1040 through air, or the reflective surfaces 1030 may receive and reflect the optical signal 1040 through a material of the encapsulant 1025. Additional optical devices may be included to control, condition and/or direct the optical signal 1040.

Figure 11:
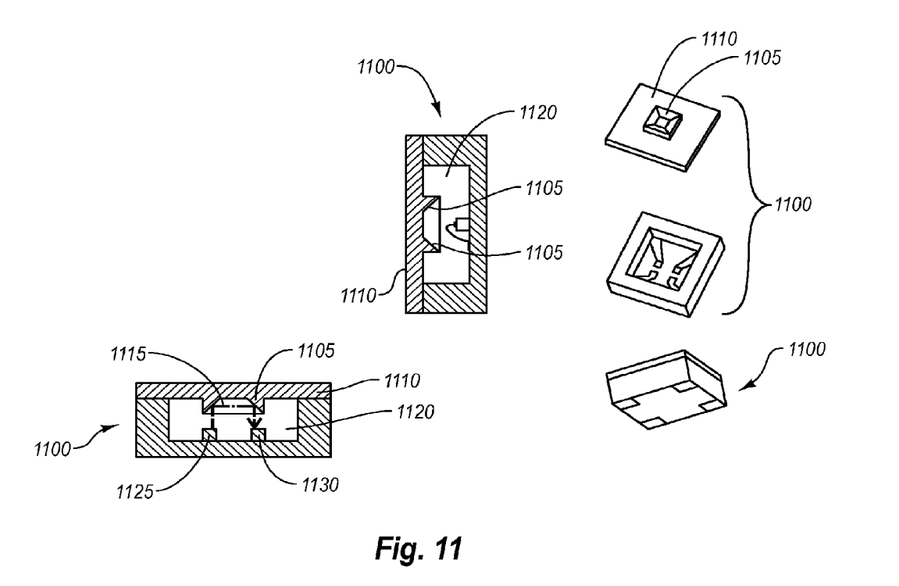

As discussed above, reflective surfaces within an opto-coupler may be used to redirect the optical signals from the optical transmitter to the optical detector through air (or a vacuum or other gas). For example, FIG. 11 illustrates a surface mount device (SMD) molded cavity package 1100 that incorporates reflecting surfaces 1105 disposed in a lid 1110 of the package 1100 itself. According to this embodiment, the light path 1115 is transmitted through air 1120 (as opposed to through material). Thus, any of the embodiments disclosed herein using reflecting surfaces where the optical signal is transmitted through material may be reconfigured to implement at least one reflecting surface where the optical signal is transmitted through air. Using reflective surfaces where the optical signal is at least partially transmitted through air may present advantages in terms of performance. For example, FIG. 11 illustrates a square package 1100 with a symmetrical four-sided reflecting surface 1105 to eliminate the optical and mechanical orientation requirement in the lid 1110 attachment. The package 1100 can also be oblong with a two-sided reflecting surface and still have no optical orientation requirement. This configuration illustrates an inexpensive package, easily tooled for prototypes, and will allow use of existing opto-chips. Driver chips for both a VCSEL 1125 and the receiver 1130 can also be included within the package 1100.

Figure 12:
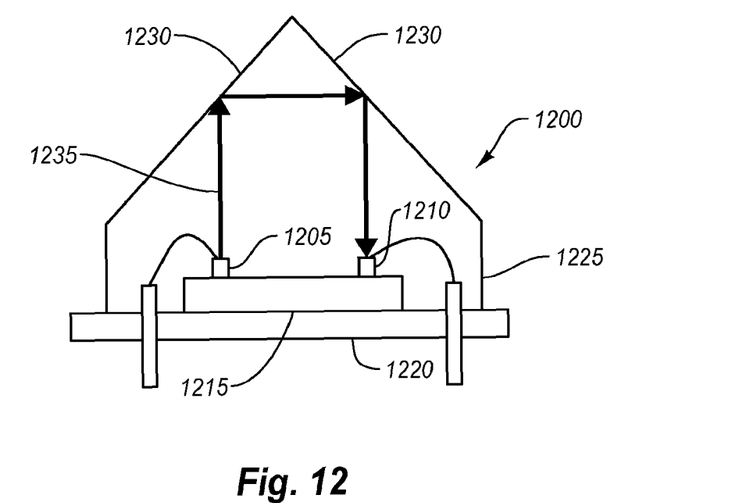

Referring to FIG. 12, an example of an opto-isolator 1200 is illustrated according to an example embodiment. The opto-isolator 1200 includes a VCSEL 1205 and a photodiode 1210 supported by a submount 1215 and a header 1220. The opto-isolator 1200 further includes a housing 1225. The housing 1225 includes, at least one reflective surface 1230 configured to redirect an optical output signal 1235 generated by the VCSEL 1205 such that the optical output signal 1235 is received by the photodetector 1210. As illustrated in FIG. 12, the housing 1225 may have multiple reflective surfaces 1230. According to other embodiments, the housing can have a single conical surface or other surfaces that redirect the optical output signal 1235 about substantially 180 degrees, or at other angles, such that the optical output signal 1235 is received by the photodetector 1210 positioned upon the submount 1215 adjacent to the VCSEL 1205.

In some embodiments, the submount 1215 may not be necessary. However, in some instances, current may be undesirably coupled through the common header 1220. In such instances the use of the submount 1215 is particularly advantageous. According to the embodiment illustrated in FIG. 12, the submount 1215 can include, or consist of, a material having poor current conducting properties, such as for example a ceramic material. Coupling of current can be further reduced by using a ceramic spacer and multiple through leads isolated from the header 1220. Laser drivers and a TIA may also be included within the housing 1225 as discussed in U.S. patent application Ser. No. 11/082,521.

Figure 13:
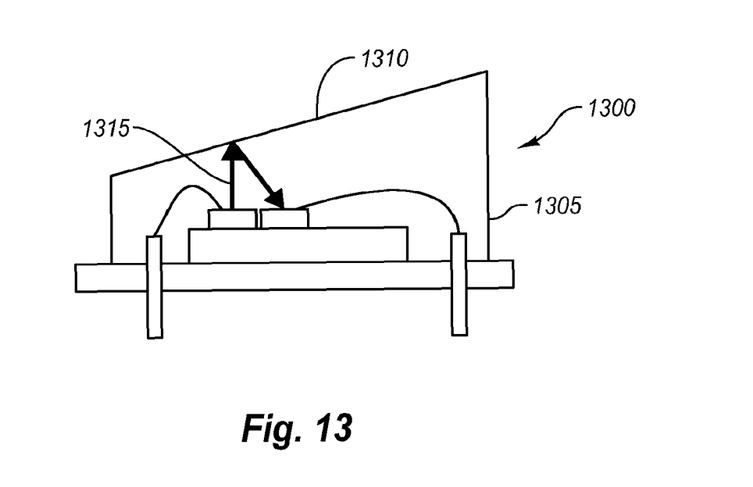

A housing of an opto-isolator package may have any number of reflective surfaces configured to redirect an optical output signal from a VCSEL, or other optical transmitter, such that it is received by a photodiode, or other optical receivers. For example, FIG. 13 illustrates an opto-isolator 1300 where a housing 1305 includes a single reflective surface 1310. The reflective surface 1310 is configured to redirect an optical output signal 1315 generated by a VCSEL 1320 such that the output optical signal 1315 is received by a photodetector 1325. The reflective surface(s) of the embodiments disclosed herein can be substantially or entirely reflective such that light is prevented from escaping from the interior of the opto-isolator. The reflective surfaces 1230 and 1310 of FIGS. 12 and 13 can be made of any material. For example, the reflective surfaces 1230 and 1310 can include plastic, metal, or other reflective material. The reflective surfaces 1230 and 1310 can be part of the package or can be a separate piece that is attached or otherwise coupled to the package. For example, the reflective surfaces 1230 and 1310 can be a separate piece that is snapped to, or glued to, a TO-Can type (or other type) of optical package.

Figure 14:
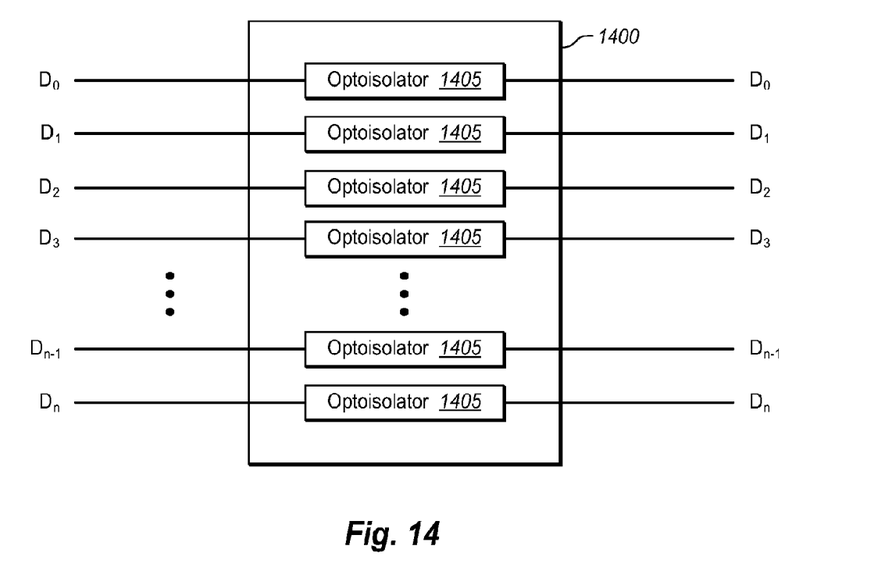
FIG. 14 discloses an opto-isolator array.

In some embodiments, multiple opto-isolators can be arranged in a single package. For example, FIG. 14 illustrates an embodiment of a package 1400 including an array of opto-isolators 1405 arranged so as to receive signals from a data bus and transition the signals to another board without the need for a serializer. The opto-isolators 1405 illustrated in FIG. 14 can include any of the opto-isolators disclosed herein, conventional opto-isolators, or any combination thereof.

Figure 15:
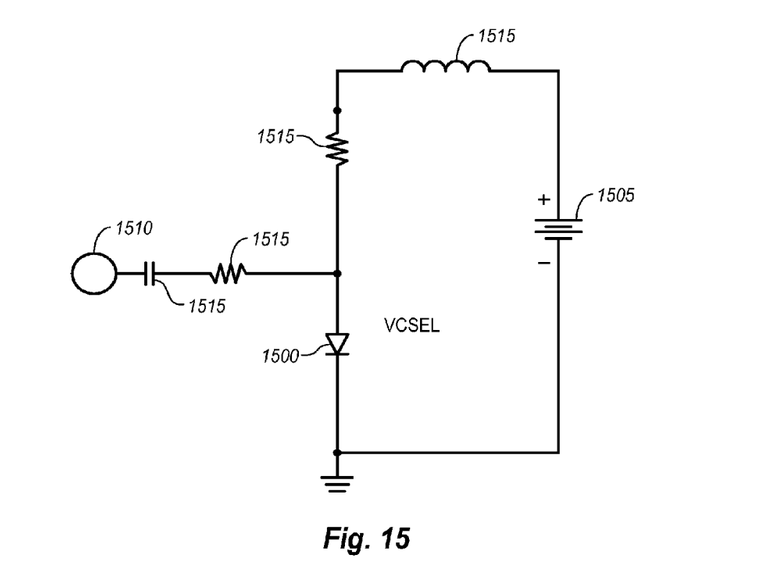
FIG. 15 discloses a schematic illustration of an opto-isolator circuit without a modulation laser driver.

In some embodiments, the laser driver may be excluded. For example, referring to FIG. 15, a schematic illustration of a circuit illustrating how a laser driver may not need to be implemented is illustrated. As shown, a VCSEL 1500 receives a bias current from a power supply 1505. Various combinations of other electronic components 1515, such as resistors, can be implemented to condition the signal. However, the modulation of the VCSEL 1500 is directly controlled by an alternating current (AC) electrical input 1510. For example, the AC electrical input 1510 can be a PECL input, which is an alternating current input. The alternating current input 1510 can be used as the modulation current of the VCSEL 1500 without the requirement of a separate laser driver having an independent modulation current source.

The opto-isolator embodiments discussed herein can be included with any circuitry and/or any electronic device. For example, referring to FIG. 16 an embodiment of an electronic device 1600 is illustrated according to an example embodiment. The electronic device 1600 can include a high-speed optical communications device that may be configured to transfer data at a rate of more than 1 Gigabit per second (Gbps). For example, the high-speed optical communications device may be configured to transfer data at a rate of 10 Gbps or more. The electronic device 1600 can also include testing equipment, a high speed oscilloscope, a computer, a radio, a wireless connection, or other circuitry.

Figure 16:
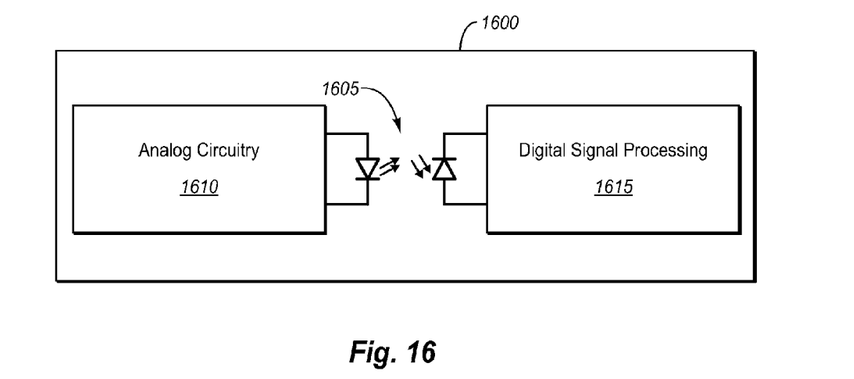
FIG. 16 illustrates an embodiment of an electronic device having an opto-isolator circuit.

The electronic device 1600 includes an opto-isolator 1605 according to any of the embodiments disclosed herein as represented schematically in FIG. 16. The opto-isolator electrically isolates portions of electronic circuits 1610 and 1615 within the electronic device 1600.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope. Detailed descriptions of apparatus and processing techniques known in the field of the invention to one of ordinary skill in the art have been excluded.

We claim:

1. An opto-isolator comprising:
   a vertical cavity surface emitting laser (VCSEL);
   a photodetector optically coupled to the VCSEL and configured to receive an output optical signal generated by the VCSEL;
   a package enclosing the VCSEL and the photodetector, wherein the package includes an encapsulant that encapsulates the VCSEL and photodetector;
   a first reflective surface positioned outside of the encapsulant and optically aligned with the VCSEL so as to receive and reflect the output optical signal; and
   a second reflective surface positioned outside of the encapsulant and optically aligned with the first reflective surface and photodetector so as to receive the reflected output optical signal from the first reflective surface and reflect the output optical signal to the photodetector.

2. An opto-isolator according to claim 1, wherein the VCSEL is disposed adjacent to the detector and optically coupled to the detector via a redirection of the optical signal by the first and second reflective surfaces.

3. An opto-isolator according to claim 1, further comprising at least one of the first or second reflective surface being concave so as to optically couple the VCSEL with the detector.

4. An opto-isolator according to claim 1, wherein at least one of the first or second reflective surface receives and redirects the output optical signal through a material of the encapsulant.

5. An opto-isolator according to claim 1, wherein at least one of the first or second reflective surface is positioned outside of the encapsulant such that the first or second reflective surface receives the output optical signal through air and redirects the output optical signal through air.

6. An opto-isolator according to claim 1, wherein at least one of the first or second reflective surface is unitarily formed with an encapsulant.

7. An opto-isolator according to claim 1, further comprising at least one of the first or second reflective surface being included in a reflective structure that is configured to redirect the output optical signal generated by the VCSEL such that the output optical signal is received by the detector by being redirected by the first reflective surface toward the second reflective surface, and then being redirected by the second reflective surface toward the detector.

8. An opto-isolator according to claim 1, further comprising a laser driver enclosed within the encapsulant.

9. An opto-isolator according to claim 1, further comprising a transimpedence amplifier enclosed within the encapsulant.

10. An opto-isolator according to claim 1, wherein at least one of the first or second reflective surface is integrated with the encapsulant.

11. An opto-isolator according to claim 1, wherein at least one of the first or second reflective surface is attached to the encapsulant.

12. An opto-isolator according to claim 1, wherein the encapsulant includes an air void such that the optical signal is at least partially transmitted through air.

13. An opto-isolator according to claim 1, wherein at least one of the first or second reflective surface receives and reflects the optical signal through material of the encapsulant.

14. An opto-isolator according to claim 1, wherein the first and second reflective surfaces are is part of a reflective structure having a semi-pyramidal structure.

15. An opto-isolator according to claim 14, wherein the reflective structure is incorporated with the encapsulant.

16. An opto-isolator according to claim 14, wherein the reflective structure is attached to the encapsulant.

17. An opto-isolator according to claim 14, wherein the reflective structure is a lid that includes the first and second reflective surfaces, such that the output optical signal is received by the detector by being redirected by a first reflective surface toward a second reflective surface, and then being redirected by the second reflective surface toward the detector.

18. An opto-isolator according to claim 17, wherein the reflective structure includes four reflective surfaces, such that the output optical signal is reflected by both of the first and second reflective surfaces.

19. An opto-isolator according to claim 1, wherein a portion of the encapsulant is at least partially opaque to a particular spectrum or range of spectrums of light.

20. An opto-isolator according to claim 1, comprising a portion of the encapsulant that is at least partially opaque to a frequency of light generated by the VCSEL.

* * * * *